United States Patent [19]

Basol et al.

[11] Patent Number: 4,950,615

[45] Date of Patent: Aug. 21, 1990

[54] METHOD AND MAKING GROUP IIB METAL - TELLURIDE FILMS AND SOLAR CELLS

[75] Inventors: Bulent M. Basol, Redondo Beach; Vijay K. Kapur, Northridge, both of Calif.

[73] Assignee: International Solar Electric Technology, Inc., Inglewood, Calif.

[21] Appl. No.: 306,469

[22] Filed: Feb. 6, 1989

[51] Int. Cl.[5] .................... H01L 31/18; H01L 21/324
[52] U.S. Cl. .................................. 437/5; 148/DIG. 1; 148/DIG. 64; 148/DIG. 94; 148/DIG. 153; 437/82; 437/101; 437/108; 437/126; 437/159; 437/160; 437/247; 437/987; 204/37.1
[58] Field of Search ...................... 148/DIG. 1, 25, 71, 148/72, 90, 94, 97, 110, 151, 169, 64, 172, 120, 153, 33, 33.1, 33.4; 204/37.1, 34.5, 38.4; 136/252, 260, 262, 264, 256, 258; 437/2–5, 81, 82, 101, 105, 109, 108, 111, 126, 159, 160, 162, 165, 247, 987

[56] References Cited

U.S. PATENT DOCUMENTS

| | | | |
|---|---|---|---|
| 4,207,119 | 6/1980 | Tyan | 427/76 |
| 4,234,353 | 11/1980 | Donaghey | 136/258 |
| 4,338,362 | 7/1982 | Turcotte | 427/314 |
| 4,386,142 | 5/1983 | Hodes | 204/129.3 |
| 4,388,483 | 10/1985 | Basol et al. | 136/260 |
| 4,529,832 | 7/1985 | Sher et al. | 136/260 |
| 4,548,681 | 10/1985 | Basol et al. | 204/37.1 |
| 4,581,108 | 4/1986 | Kapur et al. | 204/37.1 |
| 4,609,567 | 9/1986 | Toth et al. | 427/74 |
| 4,629,820 | 6/1987 | Basol et al. | 136/258 |
| 4,647,711 | 3/1987 | Basol et al. | 136/256 |

FOREIGN PATENT DOCUMENTS

0251085  11/1985  Japan ................................. 136/260

OTHER PUBLICATIONS

H. Uda et al., "All Screen Printed CdS/CdTe Solar Cell", Proc. 16th Photovoltaic Spec. Conf., 1982, pp. 801–804.

M. J. Carter et al., "Laser Processing of Compound Semiconductor Thin Films for Solar Cell Applications", 19th Proc. IEEE Photovoltaic Spec. Conf., 1987, pp. 1275–1278.

J. Kimmerle et al., "Ternary II–VI Compound Thin Films for Tandem Solar Cell Applications", Thin Solid Films, vol. 126, pp. 23–29 (1985).

T. L. Chu et al., "Deposition and Properties of Zinc Telluride and Cadmium Zinc Telluride Films", J. Appl. Phys., vol. 59, pp. 1259–1263 (1986).

Primary Examiner—Brian E. Hearn
Assistant Examiner—William D. Bunch
Attorney, Agent, or Firm—David W. Collins

[57] ABSTRACT

A technique is disclosed forming thin films (13) of group IIB metal-telluride, such as $Cd_xZn_{1-x}Te$ ($0 \leq x \leq 1$), on a substrate (10) which comprises depositing Te (18) and at least one of the elements (19) of Cd, Zn, and Hg onto a substrate and then heating the elements to form the telluride. A technique is also provided for doping this material by chemically forming a thin layer of a dopant on the surface of the unreacted elements and then heating the elements along with the layer of dopant. A method is disclosed of fabricating a thin film photovoltaic cell which comprises depositing Te and at least one of the elements of Cd, Zn, and Hg onto a substrate which contains on its surface a semiconductor film (12) and then heating the elements in the presence of a halide of the Group IIB metals, causing the formation of solar cell grade Group IIB metal-telluride film and also causing the formation of a rectifying junction, in situ, between the semiconductor film on the substrate and the Group IIB metal-telluride layer which has been formed.

51 Claims, 2 Drawing Sheets

METHOD AND MAKING GROUP IIB METAL - TELLURIDE FILMS AND SOLAR CELLS

ORIGIN OF INVENTION

The U.S. Government has certain rights to this invention pursuant to Contract No. XL-7-06074-2, issued by the Department of Energy.

TECHNICAL FIELD

This invention relates to thin film photovoltaic devices and methods of making them, and, more particularly, to the deposition in a thin film form of the elemental components of the tellurides of Group IIB metals and then the reaction of these elemental components to form a photoactive material and a photovoltaic cell.

BACKGROUND ART

Group IIB-VIA compound semiconductors in general and cadmium telluride (CdTe) in specific are well-established photovoltaic materials. Several different techniques have been used in the past to prepare CdTe polycrystalline thin films, and photovoltaic devices have been demonstrated using such thin layers.

For example, U.S. Pat. No. 4,388,483 granted to B. M. Basol et al. and assigned to Monosolar Inc., describes the fabrication of a CdS/CdTe solar cell where the thin CdTe film is obtained by a cathodic compound electroplating technique. In this patent, a method is taught where as-deposited n-type CdTe films are type-converted to form rectifying junctions with the CdS coated substrates.

U.S. Pat. No. 4,207,119 granted to Yuan Sheng Tyan and assigned to Kodak Co. describes a CdS/CdTe solar cell produced by a close-spaced sublimation method.

U.S. Pat. No. 4,338,362 by R. Turcotte and assigned to Radiation Monitoring Devices teaches the growth of CdTe films by the spray pyrolysis technique.

Other common methods such as evaporation, sputtering, and chemical vapor deposition have also been employed in preparing thin polycrystalline films of CdTe.

In all of the above-mentioned techniques, the CdTe compound is formed on a substrate which is heated during the process of film deposition. The substrate temperature is typically over 300° C., except in the electrodeposition method where the electrolyte temperature is maintained at about 90° C.

An alternative approach to compound film formation is to first deposit a composite layer of elemental components of the desired compound on a substrate, and then to react these elemental components to form the compound. For example, a screen printing method as applied to CdTe formation (H. Uda et al. in the Proceedings of the 16th IEEE Photovoltaic Specialists' Conference, 1982, pp. 801-804) uses a paste made of mainly Cd and Te powders. This paste is first screen printed on the substrate in the form of a thick film, and then it is dried and sintered at temperatures of about 600° C. to promote a reaction between the Cd and Te powders.

Another example of a process where previously deposited elemental components of CdTe are reacted to form a thin film of this compound is reported in a recent paper by M. J. Carter et al. published in the Proceedings of the 19th IEEE Photovoltaic Specialists' Conference (1987, pp. 1275-1278). In this work, researchers have evaporated four alternate layers of Te and Cd on a substrate which was cooled down to about 10° C. They then reacted these elemental layers by exposing them to pulsed radiation from an argon laser. The elemental layers were each about 700 to 1,000 Å thick. Cooling the substrate was necessary to avoid any premature interaction between the Cd and Te layers before the laser processing. It was found that any such interaction would inhibit the transformation of the whole film into CdTe during the laser processing step. This method could be a good research tool in a laboratory, but it clearly is not a practical, low-cost approach for solar cell production.

Although the attention of the photovoltaics community has so far been concentrated on CdTe as the most important Group IIB-VIA compound semiconductor for solar cell applications, other compounds from the same family of materials offer new possibilities for the production of even higher efficiency cells. For example, cadmium zinc telluride ($Cd_xZn_{1-x}Te$) and mercury zinc telluride ($Hg_xZn_{1-x}Te$) ternaries can be prepared with varying stoichiometries to obtain optical bandgap values between 1.6 and 1.8 eV, and these ternaries can be utilized as top cell materials in high efficiency tandem solar cell structures in which the bottom cell may have a copper indium diselenide ($CuInSe_2$), a mercury cadmium telluride ($Hg_xCd_{1-x}Te$) or a $Hg_xZn_{1-x}Te$ absorber with a bandgap value between 0.9 and 1.2 eV. It should be noted that the bandgaps of the ternary tellurides can be easily tuned to the desired values by changing their stoichiometries.

Most of the reported work on $Hg_xCd_{1-x}Te$ and $Hg_xZn_{1-x}Te$ thin films has been carried out for infrared detector applications. This work involves growing epitaxial layers of these materials using techniques such as MOCVD (Metallorganic Chemical Vapor Deposition), LPE (Liquid Phase Epitaxy), and MBE (Molecular Beam Epitaxy). Crystalline $Cd_xZn_{1-x}Te$ films are also useful as substrate materials for infrared detectors. However, there has been very limited work on the growth of polycrystalline layers of the ternary tellurides for solar cell applications. In U.S. Pat. No. 4,629,820, B. M. Basol et al. describe a compound electrodeposition method which yields Cd-rich $Hg_xCd_{1-x}Te$ films and solar cells. $Cd_xZn_{1-x}Te$ films of differing stoichiometries have been grown by the evaporation method disclosed by Kimmerle et al. (Thin Solid Films, Vol. 126, pp. 23-29, 1985) for solar cell applications Chu et al. have used the direct combination of gaseous elements to obtain ZnTe and $Cd_xZn_{1-x}Te$ polycrystalline layers (J. Appl. Phys., Vol. 59, pp. 1259-1263, 1986).

Doping control is very important for any semiconductor processing technique. The electrical and sometimes optical properties of semiconductors are strong functions of their doping levels Group IIB-VIA compound semiconductors such as $Cd_xZn_{1-x}Te$ can be doped p-type or n-type by introducing various dopants into these materials. Possible p-type dopants for Group IIB-VIA compounds are Cu, Ag, Au, N, P, As, Sb, Bi, 0, and the alkali metals. Excess Te would also act as an acceptor in the Group IIB-IVA tellurides. Common n-type dopants include B, Al, Ga, In, Tl, and halogens. Excess Cd, Zn, or Hg also act as donors.

Doping control is generally difficult in thin film processes. In the evaporation method, for example, dopants have to be generally co-evaporated along with the compound. In such a process, the dopant concentration in the deposited film is a complex function of the evaporation rates of the dopant and the compound, and it is also a function of the substrate temperature and even the system geometry. Repeatability in such a doping approach is very poor. In some methods, such as close-spaced sublimation, already doped source materials may be used to obtain doped thin films. The dopants, in this approach, are transferred from the source material into the growing compound film.

In addition to the ability to yield good quality material, there are two other major factors determining the feasibility of a given thin film solar cell fabrication process. These factors are the scalability of the process and its cost. The capital equipment cost, rate of film deposition, processing temperatures, and the utilization of materials are some of the important factors contributing to the cost of a thin film solar cell. The rate of deposition for the close-spaced sublimation technique, for example, is very high but this method is difficult to scale up. It also requires a pre-synthesized compound as the source material, which increases the cost. Compound electrodeposition is a simple technique but its deposition rate is quite low, being typically around 1 to 2 $\mu$m per hour. Spray pyrolysis is also a slow technique. Screen printing is attractive, in that it starts with the powders of the low-cost elemental components of the compound which can be deposited on the substrate through a relatively simple method. The drawback of this technology, however, is that it needs relatively thick layers of compounds to avoid pinholes and voids in the deposited films.

From this review of prior art, it is apparent that there is a need for an alternative technique which is simple, versatile and which has the capability of producing thin films of binary and ternary tellurides of Group IIB elements, doped or undoped, in an economical way. Consequently, an object of the present invention is to provide an inexpensive method of producing thin layers of the tellurides of Group IIB elements with various compositions. Another object of the present invention is to provide a simple technique to dope the compound layers. Still another object of the present invention is to provide a method of processing photovoltaic devices using these compounds.

DISCLOSURE OF INVENTION

In general, the present invention involves the deposition onto a substrate of a layer of Te, and at least one of the Group IIB elements Cd, Zn, and Hg, and then the reaction of these elements by heating them at a temperature between about 250° and 700° C. to form a photoactive telluride film. The elemental components of the telluride compound may be deposited over a substrate which on its surface contains a semiconductor film that forms a rectifying junction, in situ, with the deposited film during the reaction of the elemental components. Inclusion of the halides of the Group IIB metals in the elemental components during the reaction period is important to improve the device quality of solar cells thus prepared. The telluride films of this invention can be doped by dipping the unreacted elemental layers into a solution containing the dopant ions and then reacting the elements along with the dopant or by carrying out the reaction in an atmosphere containing dopant vapors.

In order to facilitate the understanding of the present invention, reference will now be made to the drawings and to some specific examples. Such examples, like the preceding summary, should not be construed as limiting the present invention which is properly set forth in the appended claims.

BEST MODES FOR CARRYING OUT THE INVENTION

Figure 1A:
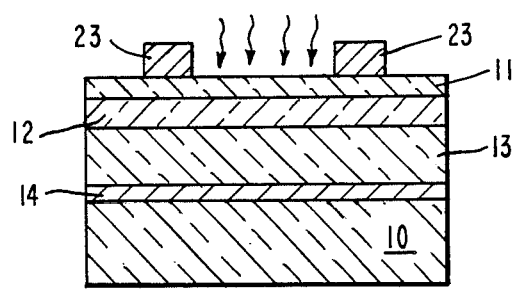
FIG. 1a depicts an alternative embodiment of the cell shown in FIG. 1.
Figure 1:
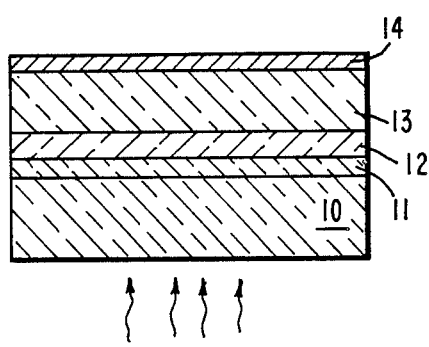
FIG. 1 is a cross-sectional view of a schematic drawing of the preferred embodiment of the photovoltaic cell constructed in accordance with the present invention.

As shown in FIG. 1, the preferred embodiment of the present invention includes a first sheet 10 of insulating transparent material such as glass. On sheet 10 is a layer 11 of a conductive transparent material such as indium tin oxide (ITO). The formation of the ITO layer 11 is done by conventional techniques and forms no part of this invention. On layer 11 is deposited a layer 12 of a semiconductor layer such as CdS. On layer 12 is formed a film 13 of a telluride of Group IIB element(s), employing the teachings of this invention. On the surface of the film 13 is deposited a layer 14 of a conductive material such as nickel to collect the generated current.

The Group IIB tellurides preferably employed in the practice of this invention are selected from the group consisting of $Cd_xZn_{1-x}Te$, $Hg_xZn_{1-x}Te$, and $Hg_xCd_{1-x}Te$, where x ranges from 0 to 1.

It should be noted that a variety of materials deposited by a variety of methods may be used in the component elements of the photovoltaic cell depicted in FIG. 1. For example, transparent conductive layers such as zinc oxide, tin oxide, cadmium oxide, and cadmium stannate may be used as the layer 11. Wide bandgap materials such as cadmium zinc sulfide, zinc selenide, zinc sulfide and cadmium selenide may be utilized as the layer 12. The total thickness of layers 11 and 12 may be from a few thousand Ångstroms to a few micrometers. If the transparent conductive oxide 11 is in itself capable of providing a rectifying junction with the telluride film 13, then layer 12 may not have to be used. Similarly, if the sheet resistance of layer 12 is low enough (typically, about 10 ohms per square or less), layer 11 may not have to be included in this structure.

The electrical type of layer 12 in the preferred embodiment is n-type, but this layer may also be intrinsic or p-type. The electrical type of layer 13 in the preferred embodiment is p-type, but it can also be n-type or intrinsic. The thickness of layer 13 is preferably about 1 to 2 $\mu$m, but it may be several micrometers thick if the need arises. Layer 14 may be a conductive material such as graphite, a metal such as gold, nickel, stainless steel, molybdenum, and silver, a semi-metal such as tellurium, a compound or alloy of a low resistivity semiconductor such as doped zinc telluride, lead telluride, mercury cadmium telluride, or a combination of any of these. The The major condition for layer 14 is that it has to be a good contact to layer 13 with no or only little adverse effect on the device performance. A grid layer may be added on the transparent conductive layer 11 if needed. Layers 11, 12 and 14 in FIG. 1 may be deposited by a variety of methods such as physical vapor deposition or chemical deposition techniques. Light enters the cell through the substrate 10.

In an alternative embodiment, shown in FIG. 1a, layer 13 may be deposited on the substrate 10, which is coated with the conducting layer 14. Layer 12 is then deposited on layer 13, followed by the transparent conductive layer 11. A grid electrode layer 23 may be formed on the transparent conductive oxide layer 11 if needed. Such grid electrode layers and the processes for forming such layers are well-known, and thus do not constitute a part of this invention. Light enters the cell through layer 11.

Figure 2:
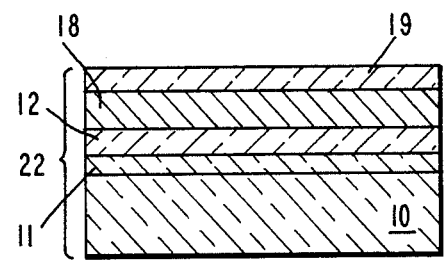
FIG. 2 is a cross-sectional view of a schematic drawing of the solar cell depicted in FIG. 1 before the reaction of the elemental components of the Group IIB metal—telluride.

FIG. 2 shows the structure of the solar cell depicted in FIG. 1 before the reaction of layers 18 and 19 containing the elemental components of the telluride film 13. In the preferred embodiment, layer 18 consists essentially of Te. Layer 19 consists essentially of at least one of the Group IIB elements, Cd, Zn, and Hg. If two Group IIB elements are present in layer 19, they can be in the form of separate discrete layers or they can be in the form of alloys such as $Cd_yZn_z$, $Cd_yHg_z$, and $Hg_yZn_z$. In the preferred embodiment of this invention, halides of the Group IIB elements (i.e., chlorides, iodides, bromides, and fluorides of Cd, Hg, and Zn) are also included in the structure of FIG. 2.

Layers 18 and 19 may be deposited by a variety of methods such as physical vapor deposition or chemical deposition or any combination of these. The relative thicknesses of the elemental layers determine the eventual stoichiometry and the thickness of the resulting telluride film 13 after the reaction.

The order of deposition for layers 18 and 19 is important, especially for tellurides containing Cd or Zn. For the formation of cadmium zinc telluride, for example, it is preferable that the Te layer be deposited first. If Cd and/or Zn is deposited first under the Te layer, then the resulting film after reaction develops pinholes and poorly adheres to its substrate. Pinholes and other defects in the film do not allow its use for solar cell fabrication. However, in the case of tellurides containing Hg, Hg can be deposited under the Te layer 18 without much adverse effect.

The halides of Cd, Zn, or Hg can be included in the structure of FIG. 2 by various means. These materials may be dispersed throughout the layers 18 and/or 19 or they can be in the form of discrete films which can be deposited over layer 19, under layer 18, or between the layers 18 and 19. The halides can be vapor deposited or formed by simply dipping the coated substrates into electrolytes containing the halide, as will be discussed in Example 2. Halide vapors may also be provided in the annealing atmosphere during reaction. The addition of halides improves the device properties of solar cells prepared in accordance with the invention. Examples of suitable halides include $CdCl_2$ and $ZnCl_2$.

Heat treatment of the structure depicted in FIG. 2 can be carried out in vacuum, in partial vacuum, in the presence of inert gases such as Ar or $N_2$, or in reducing atmospheres such as $H_2$ or forming gas. The preferred annealing atmosphere is $N_2$. The atmosphere may contain dopant elements in the vapor phase and/or a small amount of $O_2$ and/or vapors of the Group IIB metal-halides. Reaction times may vary from a few minutes to a few hours, depending upon the type of compound, the thickness of the film to be processed, and the temperature used. Preferred reaction times for films up to about 1.5 $\mu$m thick range between about 5 and 60 minutes. The reaction temperature may range from about 250° to 700° C. The preferred temperature range is between about 400° and 650° C.

Figure 3:
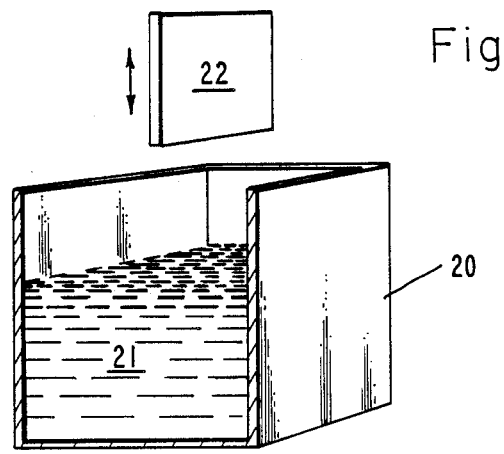
FIG. 3 is a schematic drawing of the setup used in doping the Group IIB metal—telluride films.

FIG. 3 shows the simple setup used to introduce dopants into the telluride films. Such dopant introduction is done prior to the heating step described above. The setup consists of a vessel 20 which holds the electrolyte 21. The sample 22 is dipped into the electrolyte 21 to provide a thin layer of dopant atoms on sample 22. It should be noted that sample 22 is the whole structure depicted in FIG. 2. Electrolyte 21 contains the dopant ions. The dopants have to be selected among those elements which have a more positive electrochemical potential than the element(s) on the surface of layer 19 of FIG. 2. If layer 19 of FIG. 2 consists of Cd and/or Zn, the possible dopants that can be used in electrolyte 21 are As, Bi, In, Cu, Sb, Au and Ag. Arsenic (As) cannot be used if the surface contains only Cd. None of these dopants can be used if the surface contains only Hg, due to its high positive chemical potential. Hg, however, itself can be deposited over Cd or Zn by the technique of this invention by dipping layers containing Cd and/or Zn on their surface into an electrolyte containing Hg ions.

When the sample 22 is dipped into the electrolyte 21, a chemical exchange takes place between the surface of sample 22 and the dopant species in the electrolyte 21. Some material from the surface of layer 19 of FIG. 2 gets replaced by the dopant atoms from the electrolyte 21. The amount of dopant deposited can be very well controlled by the temperature and the concentration of electrolyte 21 and the duration of the dip. Dopant concentration in the electrolyte may change from ppb (parts per billion) levels to much higher values, depending upon the electrochemical potential of the dopant species. As a general rule, it can be said that the dopant concentration required in electrolyte 21 is lower as the chemical potential difference between the elements on the surface of layer 19 and the dopant species in electrolyte 21 is larger.

The preferred embodiments of the present invention and method of making the same can be best described by reference to specific examples which will now be described.

EXAMPLES

EXAMPLE 1—Formation of $Cd_xZn_{1-x}Te$ Films with Different Stoichiometries $Cd_xZn_{1-x}Te$ films were prepared following the procedures given below:

On the sheet of glass 10 was initially deposited by vacuum techniques a layer 11 of approximately 4,000 Å of ITO having a sheet resistance of approximately 8 ohms per square. Deposited on the ITO layer 11 was a Te film 18 having a thickness of about 7,000 Å. Cathodic electrodeposition technique and an electrolyte containing 1M $H_2SO_4$, 3,000 ppm of Te and 1,000 ppm of sodium laurel sulfate as the wetting agent were used in the deposition. The plating current density used was 3 mA/cm² and the electrolyte was at room temperature.

After buffing the surface of the Te film 18 with a wet polishing cloth and 0.05 $\mu$m size alumina powder, a layer 19 of Cd was electrodeposited over the film 18 using an acidic $CdSO_4$ electrolyte (pH=0.45) at room temperature. Deposition was carried out at a current density of 20 mA/cm$^2$. Several samples were prepared with Cd layer thicknesses varying from 0 to 4,500 Å.

Over the Cd layer, a film of Zn was electrodeposited using an acidic ZnSO$_4$ solution (pH=3.5) and a current density of 50 mA/cm$^2$. Here again, the thickness of the Zn layer was varied from sample to sample to obtain films of different stoichiometries. Zn thicknesses ranged from 0 to 3,050 Å in these samples. Cd and Zn layers together constituted layer 19 of FIG. 2.

Figure 4:
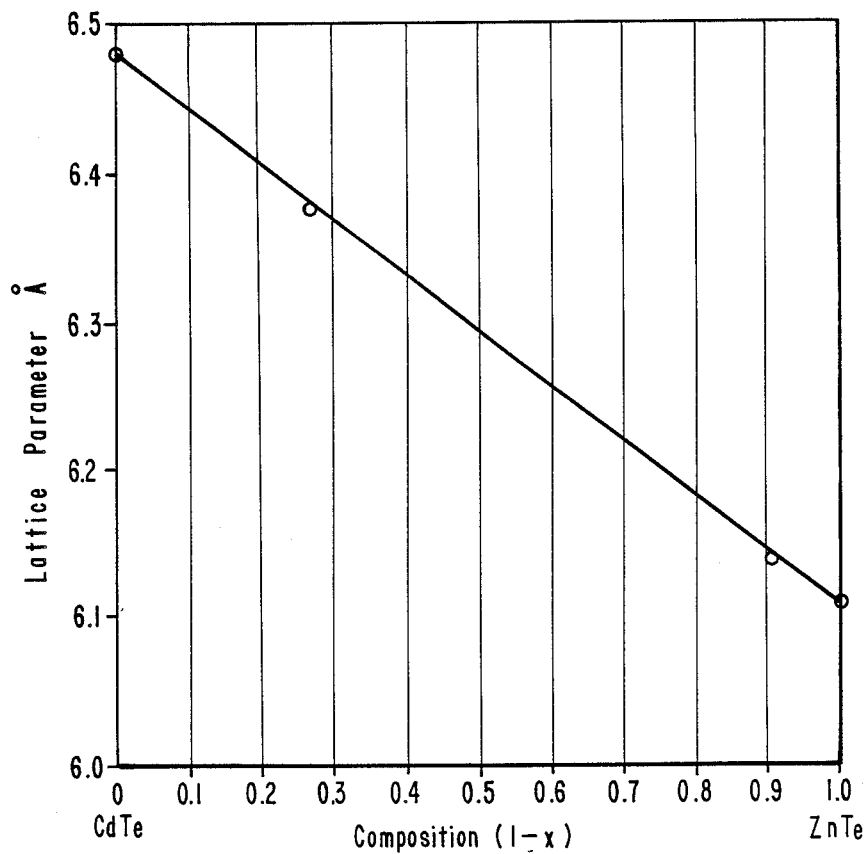
FIG. 4, on coordinates of lattice parameter and composition, shows the lattice parameters of $Cd_xZn_{1-x}Te$ films prepared by the technique of the present invention as a function of $1-x$.

After Zn plating, the whole electrodeposited structure was put in a tube furnace and heated under argon atmosphere for 60 minutes at 550° C. X-ray diffraction data taken from the reacted films confirmed the formation of Cd$_x$Zn$_{1-x}$Te with various x values. FIG. 4 shows the measured lattice parameters of four such films as a function of their stoichiometry (1−x).

Attempts to reverse the deposition sequence of the elemental layers (i.e., first depositing the Cd or Zn and then Te) did not yield continuous and smooth films.

EXAMPLE 2—Fabrication of Devices and Importance of Halides

On the sheet of glass 10 was initially deposited by vacuum techniques a layer 11 of approximately 4,000 Å of ITO having a sheet resistance of approximately 8 ohms per square. On such layer 11 was deposited by vacuum evaporation a layer of CdS 12 of a thickness of about 1.5 μm. Evaporated on the CdS layer 12 was a Te film 18 having a thickness of 7,000 Å. 5,000 Å of Cd was then electroplated over the Te layer using the conditions given in Example 1.

Half of the sample was dipped into an aqueous CdCl$_2$ solution (4 gm CdCl$_2$ in 25 ml of water), pulled out, and dried. In this manner, a layer of about 1 μm thick CdCl$_2$ was obtained over half of the area of the electroplated Cd film.

The whole structure was then placed in a tube furnace and heated under Ar atmosphere for 30 minutes at 550° C., causing the formation of a CdTe layer on the CdS film and also causing the formation of a rectifying junction between the CdS layer and the CdTe film. Devices were completed by evaporating gold contacts on the entire surface of the CdTe layer after etching it for ten seconds in 1 volume percent bromine-in-methanol solution. Solar cells measured in areas without the CdCl$_2$ layer had V$_{oc}$ and J$_{sc}$ values of 0.36V and 2.5 mA/cm$^2$, respectively. Cells in areas with the CdCl$_2$ layer gave devices with much improved parameters (V$_{oc}$=0.43V; J$_{sc}$=7.5 mA/cm$^2$).

EXAMPLE 3

Yet another photovoltaic cell illustrated in FIG. 1 was processed using all-evaporated elemental layers. In this example, first a 5,500 Å thick Te layer was evaporated onto the glass/ITO/CdS substrates of Example 2. Then a 1,200 Å thick CdCl$_2$ was vacuum deposited onto the Te layer. Finally, a 5,500 Å Cd layer was evaporated over the CdCl$_2$ film. The structure was heat treated at 590° C. for 30 minutes. Measured solar cells gave V$_{oc}$=0.53V and J$_{sc}$=15 mA/cm$^2$ under an illumination of 100 mW/cm$^2$.

An attempt to deposit the Cd under the Te layer gave rise to films that were full of defects after reaction. No devices could be made on such films.

EXAMPLE 4—Doping

Cd$_x$Zn$_{1-x}$Te films of various stoichiometries were prepared in the following manner:

A layer of Te was evaporated on a soda-lime glass substrate. The Te thickness was about 4,000 Angstroms. The substrate was then cut into three pieces. Cd$_y$Zn$_z$ alloys of different stoichiometries were evaporated onto the Te layers using a resistively-heated Mo dimple boat in a vacuum system. In this manner, three samples with x values of 0, 0.2 and 0.6 were obtained as shown in Table 1.

TABLE 1

| Resistivities of Doped and Undoped Cd$_x$Zn$_{1-x}$Te films | | | |
|---|---|---|---|
| | | Resistivity (ohm-cm) | |
| Sample | x | Undoped | Doped |
| 1 | 0 | 3000 | 0.6 |
| 2 | 0.2 | 5000 | 25 |
| 3 | 0.6 | >10$^5$ | 7,000 |

An aqueous solution of 0.005M CuSO$_4$ was then prepared. Half of the samples were dipped in this solution for 4 seconds and then they were rinsed and dried. Reaction was carried out in Ar at 550° C. for 30 minutes. Resistivity values of the doped and undoped portions of the films were measured and recorded in Table 1. It is clear that the doping method of this invention is very effective.

Another sample which was equivalent to Sample 1 of Table I was prepared to study the effect of the dipping time on the resistivities. One half of this sample was dipped into the above-mentioned doping solution for one second, while the other half was dipped for two seconds. After reaction, the resistivity of the first half was 230 ohm-cm and the resistivity of the second half was 12 ohm-cm. This again demonstrates the doping level control possible with the present invention.

INDUSTRIAL APPLICABILITY

The process of the invention is expected to find use in the preparation of Group IIA-VIB compound photovoltaic devices.

Thus, there has been disclosed a method of forming a Group II-B metal-telluride film on a substrate. Many changes and modifications of an obvious nature will occur to those of ordinary skill in this art, and all such changes and modifications are deemed to fall within the scope of the invention as defined by the appended claims.

What is claimed is:

1. A method of forming a Group IIB metal-telluride film on a substrate comprising:
    (a) depositing a layer consisting essentially of tellurium and a Group IIB metallic layer consisting essentially of at least one of the elements selected from the group consisting of cadmium, zinc, and mercury on said substrate and including a Group IIB halide selected from the group consisting of chlorides, iodides, bromides, and fluorides of cadmium, zinc, and mercury in said layers; and
    (b) heating said layers to cause a reaction, thereby forming a single layer comprising said Group IIB metal-telluride.

2. The method of claim 1 wherein said tellurium layer is deposited first on said substrate.

3. The method of claim 2 wherein said single layer consists essentially of Cd$_x$Zn$_{1-x}$Te, where x ranges from 0 to 1.

4. The method of claim 1 wherein said Group IIB metallic layer comprises two elements in alloy form.

5. The method of claim 4 wherein said two elements consist essentially of cadmium and zinc.

6. The method of claim 4 wherein said two elements consist essentially of cadmium and mercury.

7. The method of claim 4 wherein said two elements consist essentially of zinc and mercury.

8. The method of claim 1 wherein said Group IIB metallic layer contains two discrete sublayers, each sublayer consisting essentially of one of said elements.

9. The method of claim 8 wherein one of said elements consists essentially of cadmium and the other of said elements consists essentially of zinc.

10. The method of claim 8 wherein one of said elements consists essentially of cadmium and the other of said elements consists essentially of mercury.

11. The method of claim 8 wherein one of said elements consists essentially of zinc and the other of said elements consists of mercury.

12. The method of claim 1 wherein the deposited elemental components of said telluride also contain a small amount of dopant material to control the electrical type and resistivity of the formed compound semiconductor.

13. The method of claim 12 wherein said dopant is selected from the group consisting of Cu, Ag, Au, N, P, Sb, As, Bi, 0, B, Al, Ga, In, Tl, halogens, and alkali metals.

14. The method of claim 13 wherein said dopant is introduced by dipping the substrate with unreacted elemental layers in an electrolyte containing said dopant in ionic form.

15. The method of claim 1 wherein said heating is carried out at a temperature of about 250° to 700° C.

16. The method of claim 15 wherein said heating is carried out at a temperature of about 400° to 650° C.

17. The method of claim 1 wherein said heating is carried out for a time of about a few minutes to a few hours.

18. The method of claim 17 wherein said heating is carried out for a time of about 5 to 60 minutes.

19. The method of claim 1 wherein said heating is carried out in an atmosphere containing vapors of electrical dopants.

20. The method of claim 1 wherein said single layer formed by said heating ranges in thickness from about 1 to 2 $\mu$m.

21. The method of claim 1 wherein said halide consists essentially of a compound selected from the group consisting of $CdCl_2$ and $ZnCl_2$.

22. The method of claim 1 wherein said halide is included in said telluride layer by dipping the substrate/unreacted elemental layers in a solution containing said halide prior to said heating.

23. The method of claim 1 wherein said heating is carried out in an atmosphere containing vapors of a halide selected from the group consisting of chlorides, iodides, bromides, and fluorides of Group IIB elements.

24. A method of fabricating a thin film photovoltaic cell on a substrate comprising:
(a) depositing a first semiconductor layer on said substrate;
(b) depositing on said first layer a layer consisting essentially of tellurium and a Group IIB metallic layer consisting essentially of at least one of the elements selected from the group consisting of cadmium, zinc, and mercury and including a Group IIB halide selected from the group consisting of chlorides, iodides, bromides, and fluorides of cadmium, zinc, and mercury in said layers; and
(c) heating said layers (1) to cause a reaction, thereby forming a single layer comprising a telluride of said Group IIB metal and (2) to obtain a rectifying junction, in situ, between said first layer and said single layer.

25. The method of claim 24 further including forming a transparent conducting layer on said substrate prior to forming said first semiconductor layer thereon and forming a conducting layer on said single layer following said heating.

26. The method of claim 24 wherein said tellurium layer is deposited first on said substrate.

27. The method of claim 26 wherein said single layer consists essentially of $Cd_xZn_{1-x}Te$, where x ranges from 0 to 1.

28. The method of claim 24 wherein said Group IIB metallic layer comprises two elements in alloy form.

29. The method of claim 28 wherein said two elements consist essentially of cadmium and zinc.

30. The method of claim 28 wherein said two elements consist essentially of cadmium and mercury.

31. The method of claim 28 wherein said two elements consist essentially of zinc and mercury.

32. The method of claim 24 wherein said Group IIB metallic layer contains two discrete sublayers, each sublayer consisting essentially of one of said elements.

33. The method of claim 32 wherein one of said elements consists essentially of cadmium and the other of said elements consists essentially of zinc.

34. The method of claim 32 wherein one of said elements consists essentially of cadmium and the other of said elements consists essentially of mercury.

35. The method of claim 32 wherein one of said elements consists essentially of zinc and the other of said elements consists of mercury.

36. The method of claim 24 wherein the deposited elemental components of said telluride also contain a small amount of dopant material to control the electrical type and resistivity of the formed compound semiconductor.

37. The method of claim 36 wherein said dopant is selected from the group consisting of Cu, Ag, Au, N, P, Sb, As, Bi, O, B, Al, Ga, In, Tl, halogens, and alkali metals.

38. The method of claim 37 wherein said dopant is introduced by dipping the substrate/tellurium/Group IIB structure in an electrolyte containing said dopant in ionic form.

39. The method of claim 24 wherein said heating is carried out at a temperature of about 250° to 700° C.

40. The method of claim 39 wherein said heating is carried out at a temperature of about 400° to 650° C.

41. The method of claim 24 wherein said heating is carried out for a time of about a few minutes to a few hours.

42. The method of claim 41 wherein said heating is carried out for a time of abut 5 to 60 minutes.

43. The method of claim 24 wherein said heating is carried out in an atmosphere containing vapors of electrical dopants.

44. The method of claim 24 wherein said single layer formed by said heating ranges in thickness from about 1 to 2 $\mu$m.

45. The method of claim 24 wherein said halide consists essentially of a compound selected from the group consisting of $CdCl_2$ and $ZnCl_2$.

46. The method of claim 24 wherein said halide is included in said telluride layer by dipping the substrate/unreacted elemental layers in a solution containing said halide prior to said heating.

47. The method of claim 24 wherein said halide is provided in an atmosphere during said heating.

48. The method of claim 1 wherein said halide is deposited in the form of a layer at a location prior to the deposition of said tellurium layer, subsequent to said deposition of said tellurium layer and prior to said deposition of said Group IIB metallic layer, or subsequent to said deposition of said Group IIB metallic layer.

49. The method of claim 1 wherein said halide is co-deposited with at least one of said tellurium and said Group IIB metallic layers.

50. The method of claim 24 wherein said halide is deposited in the form of a layer at a location prior to the deposition of said tellurium layer, subsequent to said deposition of said tellurium layer and prior to said deposition of said Group IIB metallic layer, or subsequent to said deposition of said Group IIB metallic layer.

51. The method of claim 24 wherein said halide is co-deposited with at least one of said tellurium and said Group IIB metallic layers.

* * * * *